United States Patent
Carlsson et al.

(10) Patent No.: US 6,753,685 B2
(45) Date of Patent: Jun. 22, 2004

(54) POWER DETECTOR WITH INCREASED DETECTION RANGE

(75) Inventors: Erik Carlsson, Mölndal (SE); Mikael Ohberg, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 144 days.

(21) Appl. No.: 10/073,149

(22) Filed: Feb. 13, 2002

(65) Prior Publication Data

US 2002/0109498 A1 Aug. 15, 2002

(30) Foreign Application Priority Data

Feb. 13, 2001 (SE) .............................................. 0100454

(51) Int. Cl.[7] .............................................. G01R 31/02
(52) U.S. Cl. ..................... 324/536; 324/544; 361/142
(58) Field of Search ................................ 324/536, 534, 324/544, 541, 542, 765, 158.1, 72.5, 754, 95; 361/42; 702/58; 330/124 D, 149, 51, 298

(56) References Cited

U.S. PATENT DOCUMENTS

| | | | |
|---|---|---|---|
| 3,978,282 A | * | 8/1976 | Fulton, Jr. ................ 178/69 G |
| 4,383,189 A | | 5/1983 | D'Oro |
| 4,701,716 A | | 10/1987 | Poole |
| 5,986,500 A | * | 11/1999 | Park et al. .............. 330/124 D |
| 6,002,922 A | | 12/1999 | Schwent |
| 6,211,734 B1 | * | 4/2001 | Ahn .......................... 330/149 |

* cited by examiner

*Primary Examiner*—Kamand Cuneo
*Assistant Examiner*—Jimmy Nguyen
(74) *Attorney, Agent, or Firm*—Nixon & Vanderhye P.C.

(57) ABSTRACT

The invention relates to a device (100, 200) for use in the detection of the power that passes through an electronic device, comprising means (110) for division of the power that enters the device into a first and a second branch. Each branch receives a predetermined proportion of the total input power with a predetermined phase difference between the signals that go into the branches, and the device comprises a first power detector (140) for the first branch and a means (130) for summation of the power in the two branches. The invention is characterized in that the device (100, 200) further comprises a second power detector (150) for the second branch, and in that the means (130) for summation can be controlled with regard to which branch and thereby to which power detector (140, 150) the sum of the power is diverted, and in that the device comprises, in one of its branches, means (120) for said control of the summator.

25 Claims, 3 Drawing Sheets

POWER DETECTOR WITH INCREASED DETECTION RANGE

TECHNICAL FIELD

The present invention relates to a power detector with increased detection range, intended primarily for use in radio links at higher frequency ranges.

BACKGROUND ART

In radio transmitters it is very important to be able to detect and control transmitted power, for example in order to be able to ensure that the transmitted power does not exceed permitted limit values, or in order to be able to transmit with just enough power for the receiving party to detect the signal with sufficient strength. On account of new advanced modulation forms, such as different variants of QAM (Quadrature Amplitude Modulation), for example 64-QAM or 128-QAM, it has also become extremely important to be able to control the output power with great accuracy over a wide dynamic range.

In order to detect transmitted power, so-called power detectors are used. A problem with known power detectors is that they have a limited dynamic range.

DISCLOSURE OF THE INVENTION

An aim of the present invention is thus to provide a power detector that can provide good accuracy over a wide dynamic range, in order to enable it to be used in different modulation types, for example different variants of QAM, for example 64-QAM and 128-QAM.

This aim is achieved by the present invention by the provision of a device for use for the detection of the power that passes through an electronic device, comprising means for division of the power that enters the device into a first and a second branch, each branch having a predetermined proportion of the total input power with a predetermined phase difference between the signals that go into the branches. The device according to the invention comprises in addition a first power detector for the first branch and a means for summation of the power in the two branches, and in addition the device comprises a second power detector for the second branch. The means for summation can be controlled with regard to which branch and thereby to which power detector the sum of the power is diverted, and the device comprises, in one of its branches, means for the said control of the summator.

The fact that the device according to the invention comprises two branches with a power detector per branch, and the fact that the sum of the power can be diverted to either branch, means that the two power detectors can be calibrated for different, preferably overlapping, parts of the dynamic range to be covered. In this way, if, for example, the first power detector is being used at a particular moment and detects that the power is about to go over into the range that is covered by the second detector, the power is diverted to the second detector, and vice versa. The fact that the two power detectors can be used for different dynamic ranges means in addition that, using two power detectors with limited dynamics, the invention can still achieve good accuracy over a wide dynamic range.

The means for division of the power and the means for summation both comprise suitably a summator, which makes it expedient to use a controllable phase shifter in the means for controlling the summator.

The invention can be used both in a transmitter of electromagnetic energy and in a receiver of electromagnetic energy, and also comprises a method for the use of a device according to the invention.

BRIEF DESCRIPTION OF THE FIGURES

The invention will be described in greater detail below, with reference to the following drawings, in which.

EMBODIMENTS

Figure 1:
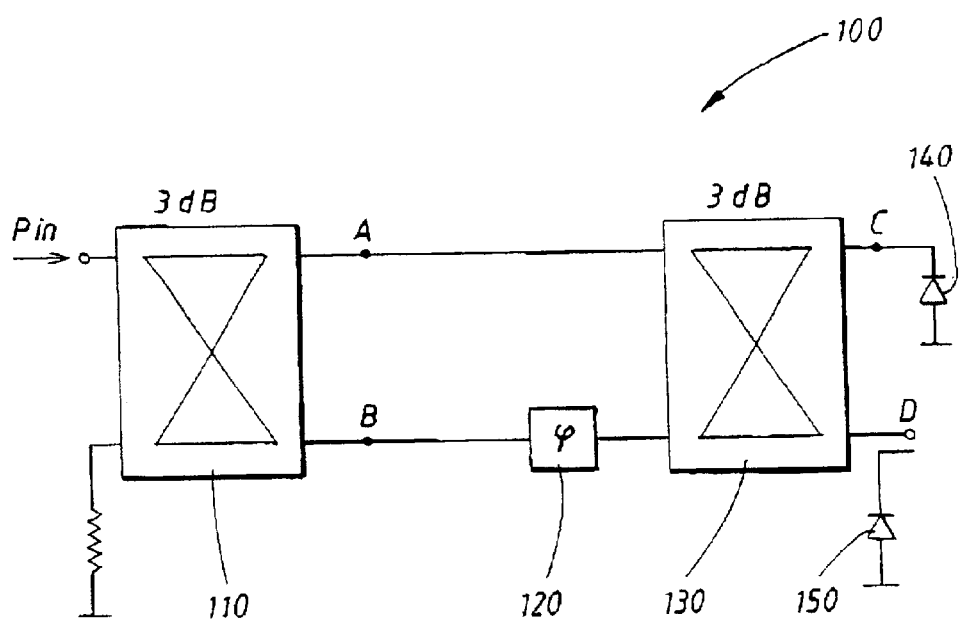
FIG. 1 shows an embodiment of the invention.

FIG. 1 shows a basic embodiment 100 of a power detector according to the invention. This comprises a first reciprocal summator 110 with a first and a second input, where the first summator is used to transmit to the detector 100 the power $P_{in}$ that enters it, the power being divided up by means of the summator into a first and a second branch, with a predetermined phase difference between the signals in the two branches. The phase difference is suitably achieved by the signals going different electrical path lengths in order to reach the respective branches. To facilitate the discussion concerning the phase difference, a number of points have been defined in FIG. 1: The point "Q" which is the input signal to the first summator, and the points "A" and "B" which are the output signals from the first summator 110 in the first and the second branches respectively. The summators that are used are suitably, but not necessarily, directional couplers realized in MMIC (Microwave Monolithic Integrated Circuit) technology.

The phase difference between the points that have been discussed so far can be summarized as follows: The signal that goes from Q to B will have 90 degrees phase shift in relation to the signal that goes from Q to A. In other words, the phase difference between the signals at the points A and B will be 90 degrees. The fact that the phase difference is given as 90 degrees is only to be regarded as an example. In principle, other phase differences can also be used, depending upon what aim is to be achieved, which will be apparent from the description below.

The detector 100 comprises in addition a controllable phase shifter 120, the function of which will be described briefly later in the description.

In the detector 100 there is also a second reciprocal summator 130 which, like the first reciprocal summator 110, divides up the power that enters it into a first and a second branch, with a predetermined phase difference between the signals in the two branches. In the application in question, the phase difference that is achieved in the second phase detector is also 90 degrees.

A first 140 and a second 150 power detector, in this example realized by means of diodes, are also incorporated in the device 100 according to the invention, and each of these is connected to one of the outputs of the second summator, in other words the first power detector 140 is connected to the first branch of the device, and the second power detector 150 is connected to the second branch of the device. To facilitate the continued discussion concerning phase differences in the device 100, an additional two points have been defined in FIG. 1, the point C at the output of the first branch in the second summator, and the point D at the output of the second branch in the second summator. The signals that come from the points A and B will be transmitted through the second summator with the following phase differences:

A to C: 0 degrees
A to D: 90 degrees
B to C: 90 degrees
B to D: 0 degrees

To sum up, the signal from the point Q will thus reach the point D either from A to D (Q–A–D), or via B to D (Q–B–D), which in both cases gives a phase difference of 90 degrees. Both the signals will thus be added in phase, and thereby amplify each other. On the other hand, the signal to the point C from the point Q will come via either Q–A–C or Q–B–C, which gives a phase difference of 180 degrees between the two signals, which thus are added out of phase and cancel each other out at the point C.

Figure 2:
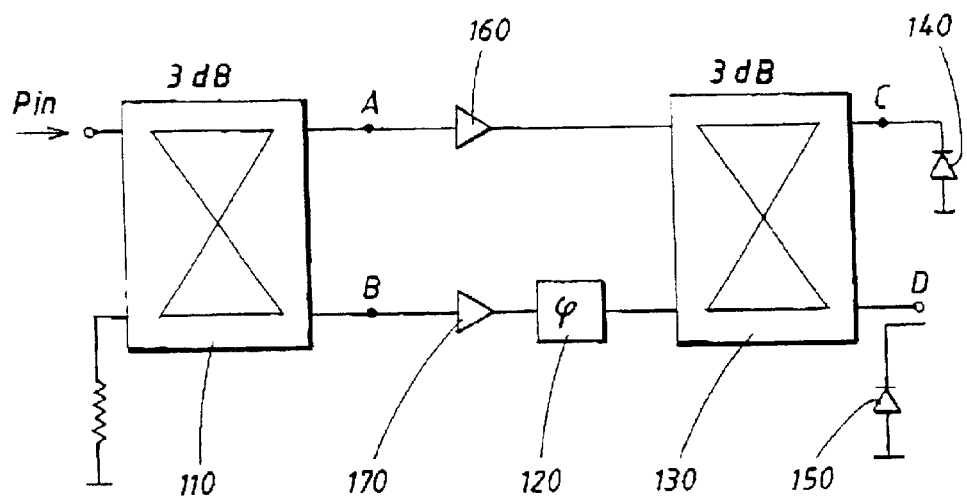
FIG. 2 shows a variant of the embodiment in FIG. 1.

FIG. 2 shows a slightly enlarged embodiment 200 of the invention. This embodiment comprises, in addition to what has been shown in the embodiment 100 in FIG. 1, also a control device 180 (not shown) for controlling the controllable phase shifter 120, in addition to an amplifier 160 in the first branch and an amplifier 170 in the second branch. In order to benefit from the invention, the two power detectors 140 and 150 are calibrated to detect power within different partial ranges of the dynamic range that is to be covered, preferably with a certain overlap. If the total dynamic range that is to be covered with the device 200 is a range 0–100, it can be expedient for the power detector 140 to cover the range 0–55 and the second power detector 150 to cover the range 45–100. One power detector, in this case the first, is thus a power detector for weaker power, and the other power detector is for stronger power.

According to what has been described above, the power at the point C, in other words the power that is detected by the first power detector 140, will initially be zero due to fade-out effects caused by phase differences. Both the power detectors are connected to a means 180 (not shown) for controlling the phase shifter 120. This control device detects the detected power, and provided the power is within the range that the second power detector 150 is designed for, the control device will set the phase shifter to give a phase shift of zero degrees, which according to the discussion above means that all the power goes to the point D, in other words the second power detector. If, on the other hand, the control device 180 (not shown) detects that the power is about to enter the range for which the first power detector 140 is calibrated, the control device will set the phase shifter in such a way that the signal in the second branch has an additional phase shift of ninety degrees.

With the phase shifter set to a phase shift of ninety degrees, the signal from the point Q will thus reach the point D either from A to D (Q–A–D), or via B to D (Q–B–D), with a phase difference between the signals of 90 degrees, and the signal to the point C from the point Q will come via either Q–A–C or Q–B–C, which gives a phase difference of 270 degrees between the two signals. In other words, with the phase shifter set to a phase shift of ninety degrees, half of the input signal to the device will go to each power detector, which means that the first power detector 140 can be used to detect power.

By means of the invention, two power detectors with relatively limited dynamic ranges can thus be used together in order to detect power within a wide dynamic range with great accuracy. When the power input to the device according to the invention lies within the range for which the second power detector is designed, the phase shifter is set to give a phase shift of zero degrees, which means that all the power will go to the second power detector, and when the power is within the ranges for which the first power detector is designed, the phase shifter is set to give a phase shift of ninety degrees, which means that half the power goes to the first power detector, which can thereby be used to detect power within the range for which it is designed.

Figure 3:
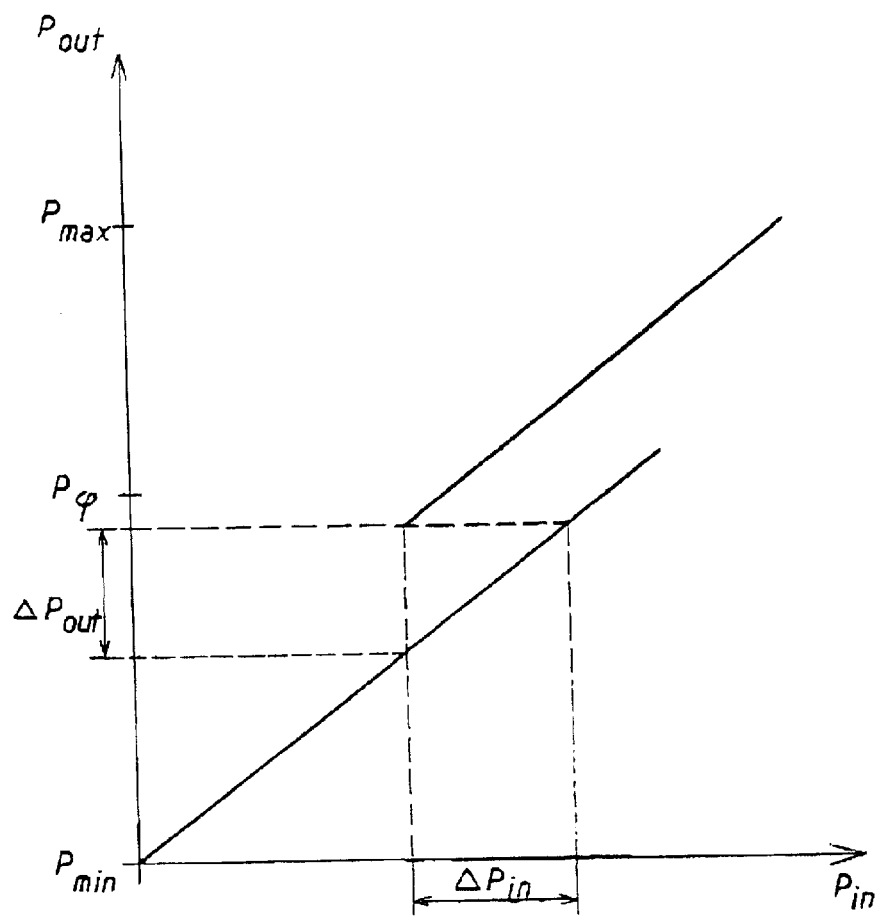
FIG. 3 shows the output power as a function of the control voltage.

FIG. 3 shows the output power $P_{out}$ in the device 100, 200 (the power at the point D in FIGS. 1 and 2) as a function of the input power $P_{in}$. When the output power $P_{out}$ lies within a higher range, in FIG. 3 designated Pmax–Pϕ, the second power detector 150 is used, and when $P_{out}$ lies within a lower range, designated Pϕ–Pmin, the first power detector 140 is used. The range Pmax–Pϕ for the second power detector 150 and the range Pϕ–Pmin for the first power detector 140 overlap each other slightly, which has been explained above and is shown in FIG. 3.

However, in the event of a change-over to the first power detector, as has been described above, a certain part of the power $\Delta P_{out}$ will be diverted to this power detector, which means that the power reduces at the point D in FIGS. 1 and 2, by a value $\Delta P_{out}$. As the point D is the point where the device 200 is connected to other equipment, and thereby the point where the power that enters the device 200 is to be used, it is necessary to compensate for the power loss $\Delta P_{out}$. In order to compensate for the power loss at the point D when the first power detector is used, it is expedient to compensate the input power ($P_{in}$ in FIG. 2) to the device 200 by a corresponding amount, which is suitably carried out by the control device 180 (not shown) also being used in a regulating loop in order to regulate the input power to the device, so that the input power $P_{in}$ is increased to the extent $\Delta P_{in}$ as is required to retain the output power $P_{out}$ at the level it would have attained with continued use of the second power detector. If an adjustment for the power loss is not carried out in the event of the connection of the first power detector, the information that the signal carries could, for example, be incorrect, as in certain modulation forms, such as QAM, there is also information content in the amplitude of the signal.

Figure 4:
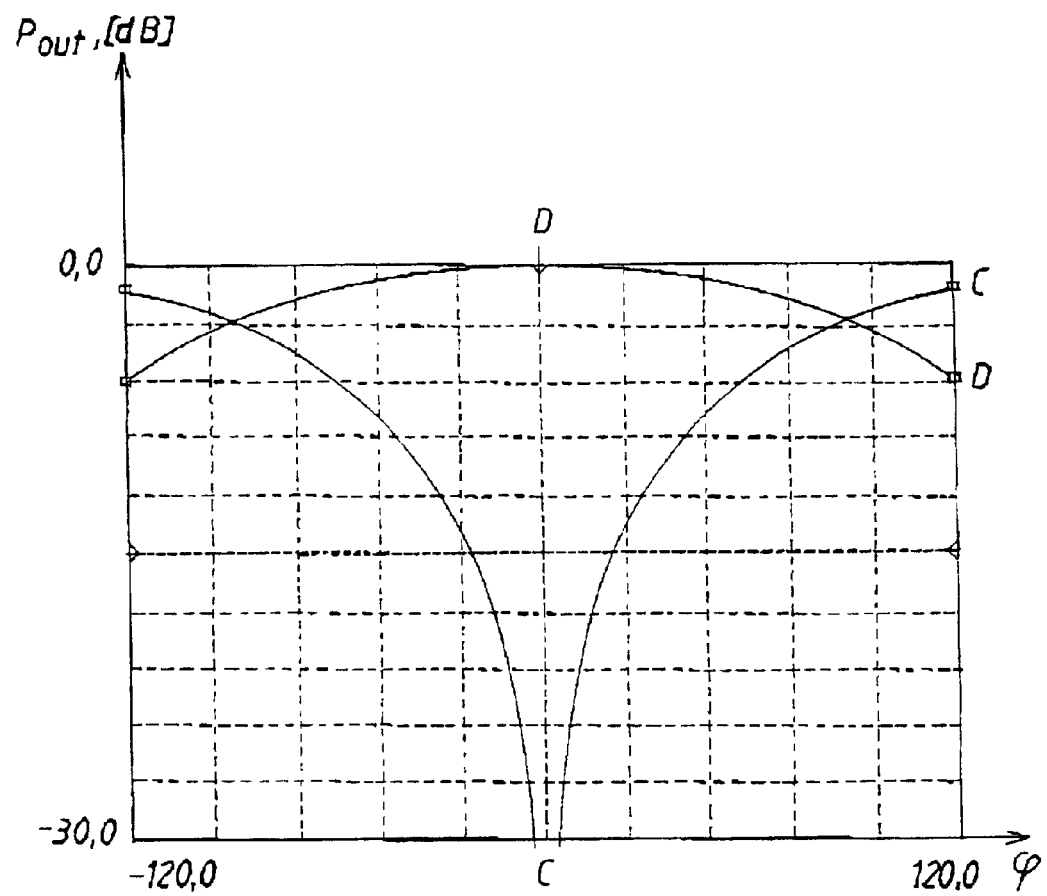
FIG. 4 shows a graph of the division of power to the detectors as a function of the phase setting.

In order to clarify further the function of the invention, FIG. 4 shows the power at the points C and D as a function of the setting of the phase shifter 120, zero or ninety degrees. As shown by FIG. 4, at a setting of zero degrees of the phase shifter 120, all the power will be diverted to the point D, and at a setting of the phase shifter of ninety degrees, equal amounts of power will go to both the points C and D.

The invention is not limited to the embodiments shown above, but can be varied freely within the framework of the attached patent claims. For example, it is possible to have a phase shifter in each branch, instead of only having a phase shifter in one branch as shown above. What is important is that the combined phase difference between the branches is the required difference. For example, one possibility is to use two phase shifters, one in each branch. If a phase difference of ninety degrees is to be obtained, the phase shifter in one branch is set to change from zero to 45 degrees, while at the same time the phase shifter in the second branch is set to change from zero to minus 45 degrees, so that the combined phase difference is 90 degrees.

The required phase difference can, of course, be other than the phase difference or phase differences described above, depending upon what division of the power is required between the branches. In addition, the phase difference between the branches can be changed in smaller steps than in one single instantaneous step of 90 degrees. It is possible to let the phase difference vary in a completely stepless way within a particular range, or in individual steps, with the input power Pin being suitably adjusted in a corresponding way.

What is claimed is:

1. A device for use in the detection of power that passes through an electronic device, comprising:
   means for division of power that enters the device into a first and a second branch, each branch having a predetermined proportion of total input power with a predetermined phase difference between respective signals that go into the branches,
   a first power detector for the first branch,
   a second power detector for the second branch,
   means for summation of the power in the two branches,
   wherein the first and the second power detectors are calibrated for different sub-ranges of a dynamic range within which it is desired to carry out the power detection, and
   wherein the means for summation can be controlled with regard to which branch and thereby to which power detector a sum of the power is diverted, and
      in at least one of its branches, means for said control of the means for summation.

2. A device according to claim 1, in which device the sub-ranges for which the first and the second power detectors are calibrated are overlapping.

3. A device according to claim 1, in which the means for division of the power and the means for summation both comprise a summator.

4. A device according to claim 1, in which at least one of the means for division of the power and the means for summation are designed in MMIC-technology.

5. A device according to claim 1, in which the means for controlling the summator comprises a controllable phase shifter.

6. A device according to claim 1, further comprising means for amplification in each branch of the device.

7. A device according to claim 1, comprising means for controlling the means for summation in both the first branch and the second branch.

8. A device according to claim 1, in which the electronic device for which the invention is used is a device for the transmission of electromagnetic energy.

9. A device according to claim 1, in which the electronic device for which the invention is used is a device for the reception of electromagnetic energy.

10. A method of detecting power that passes through an electronic device, the method comprising:
    dividing power that enters the device into a first and a second branch, each branch being given a predetermined proportion of the total input power with a predetermined phase difference between the signals that go into the branches,
    performing user-defined detection of the power in the first branch and summation of the power in the two branches,
    performing user-defined detection of the power in the second branch,
    wherein the user-defined detection in the first branch and the user-defined detection in the second branch are calibrated for different sub-ranges of a dynamic range within which it is desired to carry out the detection according to the method, and
    controlling the summation with regard to which branch and thereby to which detection the sum of the power is diverted, said controlling of the summator being carried out via at least one of the branches.

11. The method of claim 10, according to which the sum of the power is diverted to the user-defined detection within whose sub-range the power can be detected.

12. The method according to claim 10, in which the different sub-ranges of the user-defined detection in the first and in the second branch are overlapping.

13. The method according to claim 10, according to which the division of the power and the summation of the power are carried out by means of a summator.

14. The method according to claim 10, in which the control of the summator comprises phase shifting of the signal in one of the branches.

15. The method according to claim 10, further comprising amplification of the signals in each branch of the device.

16. The method according to claim 10, further comprising control of the summator via both the first branch and the second branch.

17. The method according to claim 10, in which the electronic device for which the method is used is a device for the transmission of electromagnetic energy.

18. The method according to claim 10, in which the electronic device for which the method is used is a device for the reception of electromagnetic energy.

19. A device for use in the detection of power that passes through an electronic device, comprising:
    a power divider which divides power that enters the device into a first and a second branch, each branch having a predetermined proportion of total input power with a predetermined phase difference between respective signals that go into the branches;
    a first power detector for the first branch;
    a second power detector for the second branch;
    a summator which sums of the power in the two branches;
    wherein the first and the second power detectors are calibrated for different sub-ranges of a dynamic range within which it is desired to carry out the power detection, and
    a controller in at least one of the branches which controls the summator with regard to which branch and thereby to which power detector a sum of the power is diverted.

20. A device according to claim 19, in which device the sub-ranges for which the first and the second power detectors are calibrated are overlapping.

21. A device according to claim 19, wherein the controller comprises a controllable phase shifter.

22. A device according to claim 19, further comprising an amplifier in each branch of the device.

23. A device according to claim 19, wherein the controller is in both the first branch and the second branch.

24. A device according to claim 19, in which the electronic device is a device for the transmission of electromagnetic energy.

25. A device according to claim 19, in which the electronic device is a device for the reception of electromagnetic energy.

* * * * *